(12) United States Patent
Kuitani

(10) Patent No.: US 9,684,053 B2
(45) Date of Patent: Jun. 20, 2017

(54) WAFER FOR TESTING AND A TEST SYSTEM

(71) Applicant: ADVANTEST CORPORATION, Tokyo (JP)

(72) Inventor: Tetsuya Kuitani, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 33 days.

(21) Appl. No.: 14/626,924

(22) Filed: Feb. 20, 2015

(65) Prior Publication Data

US 2015/0268275 A1 Sep. 24, 2015

(30) Foreign Application Priority Data

Mar. 19, 2014 (KR) .................. 10-2014-0031943

(51) Int. Cl.
*G01R 35/00* (2006.01)
(52) U.S. Cl.
CPC .................... *G01R 35/00* (2013.01)
(58) Field of Classification Search
CPC ...................................................... G01R 35/00
See application file for complete search history.

(56) References Cited

U.S. PATENT DOCUMENTS

| 8,134,379 B2* | 3/2012 | Komoto | G01R 1/07378 |
| | | | 324/754.07 |
| 2006/0273809 A1* | 12/2006 | Miller | G01R 31/2889 |
| | | | 324/750.05 |
| 2012/0326743 A1* | 12/2012 | Chang | G01R 31/2884 |
| | | | 324/755.01 |

FOREIGN PATENT DOCUMENTS

| CN | 103293503 A | 9/2013 |
| JP | S62-78842 A | 4/1987 |
| JP | H1-318245 A | 12/1989 |
| JP | H05-166893 A | 7/1993 |

OTHER PUBLICATIONS

Notice of Office Action for Taiwan Patent Application No. 104105037, issued by the Taiwan Intellectual Property Office on Dec. 15, 2015.
Notice of Office Action for Japanese Patent Application No. 2015-007662, issued by the Japan Patent Office on Mar. 1, 2016.

* cited by examiner

*Primary Examiner* — Clayton E Laballe
*Assistant Examiner* — Noam Reisner

(57) ABSTRACT

To test a probe card with an examination apparatus that tests a device under test, provided is a test system that tests a device under test and includes a test section that includes a plurality of test units that input or output a signal; a probe card that includes a plurality of probe terminals connected to a terminal of the device under test, and transmits signals between the device under test and the test section; and a wafer for testing that is connected to the probe card, instead of the device under test, when testing the probe card, and includes a connection wire that electrically connects two of the probe terminals to each other. The test section measures output of at least one of two test units connected to the two probe terminals, and judges pass/fail of the two probe terminals.

4 Claims, 9 Drawing Sheets

WAFER FOR TESTING AND A TEST SYSTEM

The contents of the following Korean patent application are incorporated herein by reference: NO. 2014-0031943 filed on Mar. 19, 2014.

BACKGROUND

1. Technical Field

The present invention relates to a wafer for testing and a test system.

2. Related Art

When testing a device under test, a probe card is provided between a test head and a wafer on which the device under test is arranged. Conventionally, when testing the probe card, an examination apparatus is used for testing the probe card, and this examination apparatus is different from the test apparatus used when testing the device under test, as shown in Patent Document 1, for example.

Patent Document 1: Japanese Patent Application Publication No. H05-166893

Therefore, when testing the probe card, it has been necessary to move the probe card from the test apparatus of the device under test to the examination apparatus used for the probe card.

SUMMARY

According to a first aspect of the present invention, provided is a wafer for testing that tests a probe card including a plurality of probe terminals connected to a terminal of a device under test, the wafer for testing comprising a connection wire that electrically connects two probe terminals of the probe card to each other.

According to a second aspect of the present invention, provided is a test system that tests a device under test, comprising a test section that includes a plurality of test units that input or output a signal; a probe card that includes a plurality of probe terminals connected to a terminal of the device under test, and transmits signals between the device under test and the test section; and a wafer for testing that is connected to the probe card, instead of the device under test, when testing the probe card, and includes a connection wire that electrically connects two of the probe terminals to each other. The test section measures output of at least one of two test units connected to the two probe terminals, and judges pass/fail of the two probe terminals.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
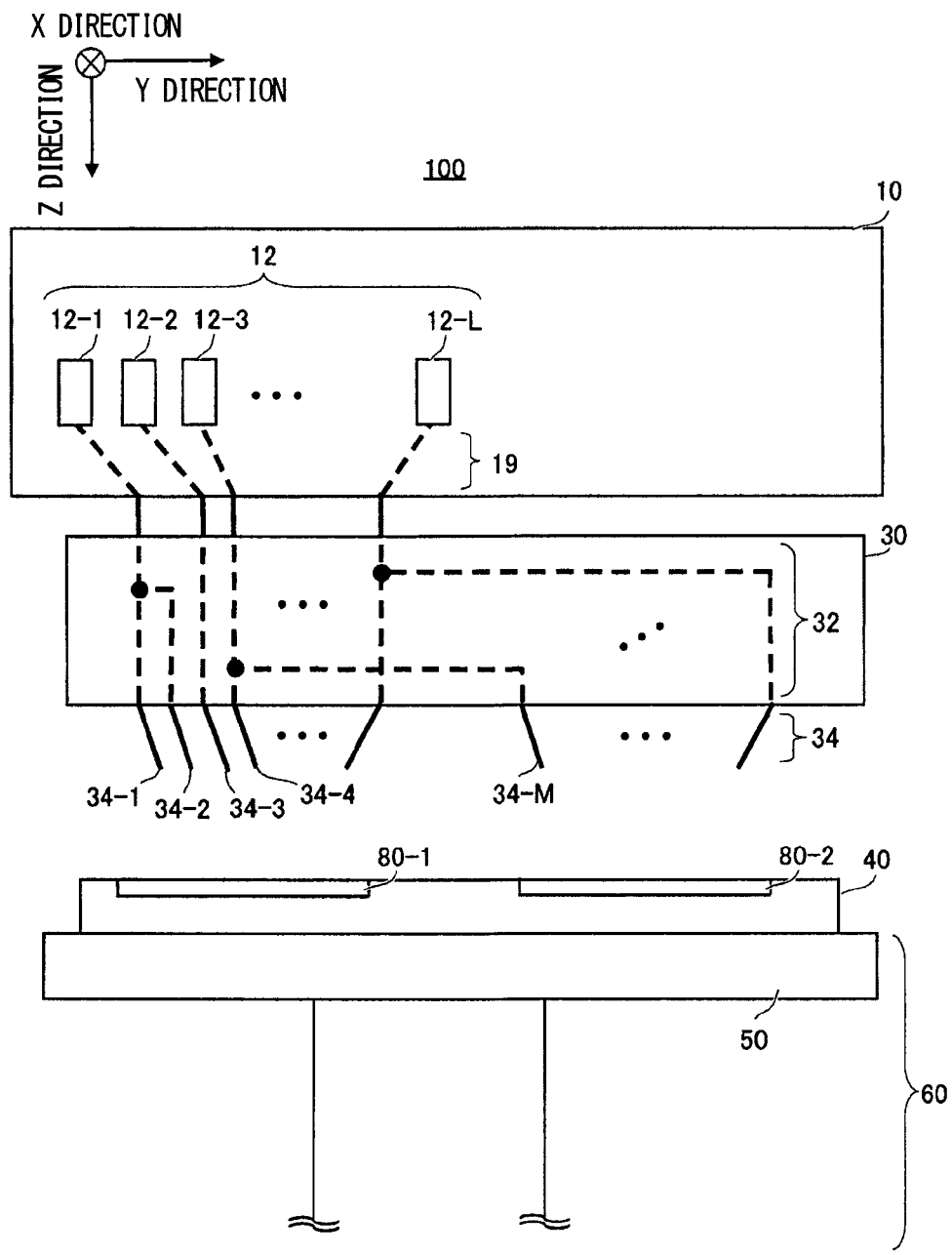
FIG. 1 shows a test system 100.

FIG. 1 shows a test system 100. The test system 100 tests a plurality of devices under test (DUTs) 80 formed on a wafer under test 40. The test system 100 includes a test head 10 as part of a test section, a probe card 30, and a prober 60.

The probe card 30 is provided between the test head 10 and the wafer under test 40. The probe card 30 includes a plurality of probe terminals 34 that are connected to the wafer under test 40 mounted on the prober 60. The prober 60 includes a wafer stage 50 that moves with the wafer under test 40 mounted thereon.

The probe terminals 34 are provided to correspond respectively to the terminals of a plurality of DUTs 80. One group of probe terminals 34 is provided to correspond to one DUT 80. In the example of FIG. 1, the groups of probe terminals 34 are arranged in the Y direction. However, the groups of probe terminals 34 may instead be arranged in the X direction, or may form two or more rows. The arrangement of the probe terminals 34 may be adjusted as desired, according to the design of the devices. The probe card 30 includes a connection wire 32 therein. The connection wire 32 connects the test head 10 to the probe terminals 34.

The prober 60 causes the position of the wafer under test 40 relative to the probe card 30 to move in the X direction, the Y direction, and the Z direction. The X direction and the Y direction are two non-parallel directions that define a horizontal plane. The Z direction is a direction that defines the vertical direction. With the prober 60, the terminals of the DUTs 80 are connected to the plurality of probe terminals 34.

The probe card 30 transmits signals between the test head 10 and the plurality of DUTs 80. The test head 10 includes a connection wire 19 and a plurality of test units 12. The connection wire 19 connects the test units 12 to the probe terminals 34.

Each test unit 12 includes at least one of a function to output a signal and a function to measure a signal. When testing a DUT 80, at least one of the test units 12 connected to the DUT 80 outputs a signal to the DUT 80. The probe card 30 inputs, to the DUT 80, the signal output by a test unit 12. Furthermore, the probe card 30 inputs, to one of the test units 12, a signal generated by the DUT 80. The test head 10 judges pass/fail of the DUT 80 based on the measurement result of the signal from the test unit 12. The test head 10 may cooperate with a mainframe of a tester to generate a signal and judge pass/fail of the DUT 80.

Furthermore, the test head 10 may judge pass/fail of the DUT 80 based on a signal supplied from the test unit 12 to the DUT 80. For example, the test head 10 may judge pass/fail of the DUT 80 according to whether a voltage or current level supplied to the DUT 80 from the test unit 12 is within a prescribed range.

Each test unit 12 may be connected to a plurality of probe terminals 34. However, it should be noted that at least one of the test units 12 among the plurality of test units 12 connected to one DUT 80 is connected in a manner to correspond one-to-one with one probe terminal 34. In the example of FIG. 1, the test unit 12-2 is connected in a manner to correspond one-to-one with the probe terminal 34-3. In this Specification, a probe terminal 34 that is connected in a one-to-one manner to a single test unit 12 is referred to as a "branchless pin."

Furthermore, in this Specification, probe terminals 34 that are not branchless pins are referred to as "branched pins." In the example of FIG. 1, the test unit 12-1 and the probe terminal 34-1 and probe terminal 34-2 are connected by branching within the probe card 30. In other words, the probe terminal 34-1 and the probe terminal 34-2 are branched pins.

The test unit 12-3 and the probe terminal 34-4 and probe terminal 34-M are connected by branching within the probe card 30. The characters "L" and "M" recorded in FIG. 1 are natural numbers. The probe terminal 34-4 is connected to the DUT 80-1. The probe terminal 34-M is connected to the DUT 80-2, which is separate from the DUT 80-1. In other words, the probe terminal 34-4 and the probe terminal 34-M are connected to different DUTs 80.

Figure 2:
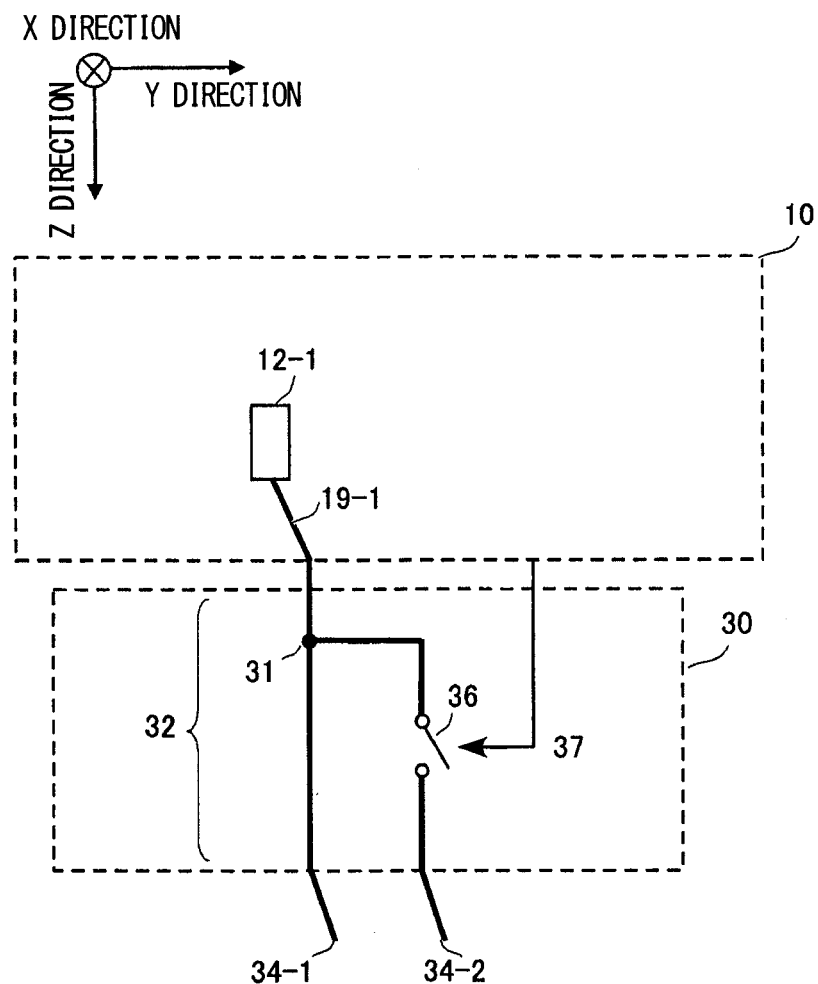
FIG. 2 shows another example of a branched pin.

FIG. 2 shows another example of a branched pin. In the branched pin shown in this example, the connection wire 32 further includes a switch 36 between the branch 31 and the probe terminal 34-3.

The switch 36 is turned ON or OFF by a control signal 37. The switch 36 is controlled by the control signal 37 output from the test head 10, for example. When the switch 36 is ON, the connection wire 32 functions as a wire of the branched pin. In other words, the test unit 12-1 is connected to the probe terminal 34-1 and the probe terminal 34-2. On the other hand, when the switch 36 is OFF the test unit 12-1 is connected to the probe terminal 34-1 and disconnected from the probe terminal 34-2. In this way, the connection wire 32 functions as a wire of the branchless pin.

The probe card 30 may include a plurality of the branched pins as described in this example. Each switch 36 for one of these branched pins is turned ON and OFF according to a control signal 37. Accordingly, by controlling the switches 36 in the probe card 30, a plurality of branched pins can be selectively set to be branchless pins.

Figure 3:
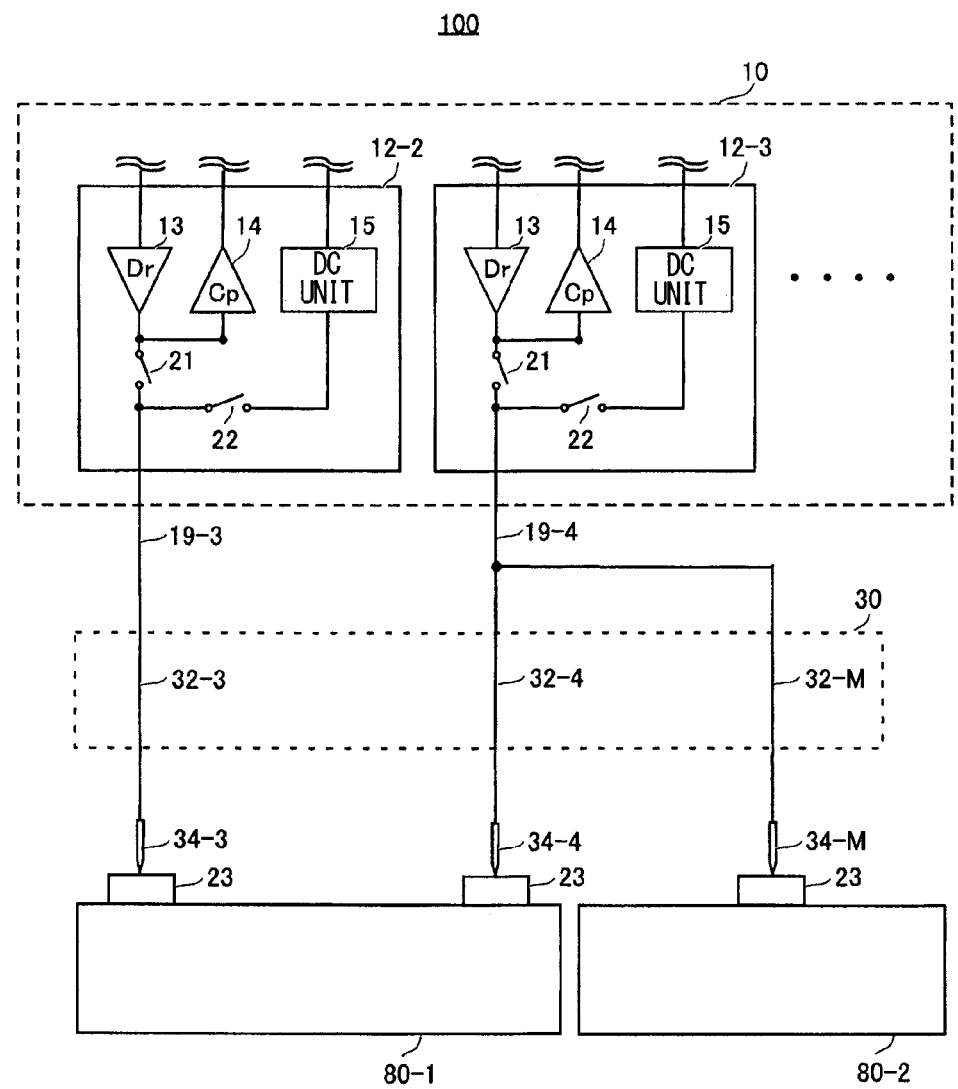
FIG. 3 shows test units 12, the probe card 30, and a DUT 80.

FIG. 3 shows test units 12, the probe card 30, and a DUT 80. Each test unit 12 includes a driver section 13, a comparator section 14, a DC unit 15, a switch 21, and a switch 22. The driver section 13 outputs a signal having a waveform corresponding to a prescribed data pattern. The comparator section 14 compares the level of the input signal to a prescribed reference level, and converts the input signal into a binary signal. The DC unit 15 measures the current value or voltage value when a prescribed voltage or current is output.

The switch 21 switches whether the driver section 13 and the comparator section 14 are connected to the probe card 30. The switch 22 switches whether the DC unit 15 is connected to the probe card 30.

In a test unit 12 that performs function testing of a DUT 80, the switch 21 is ON and the switch 22 is OFF. The driver section 13 of a test unit 12 that performs function testing outputs a test signal having a prescribed data pattern. The probe card 30 inputs the test signal to one of the terminals 23 of the DUT 80. Furthermore, the probe card 30 inputs, to another test unit 12 that performs function testing, a response signal output from one of the terminals 23 of the DUT 80. The comparator section 14 of the test unit 12 into which the response signal is input converts the response signal into a binary signal. The test head 10 judges whether the pattern of this binary signal matches a prescribed expected value pattern.

In a test unit 12 that performs DC testing of a DUT 80, the switch 21 is OFF and the switch 22 is ON. The DC unit 15 of the test unit 12 that performs DC testing outputs a voltage with a set level and measures the current level output by the DC unit 15 at this time. Furthermore, the DC unit 15 outputs a current with a set level and measures the voltage level output by the DC unit 15 at this time.

With this configuration, the test system 100 tests the DUT 80. The test system 100 has a function of testing the probe card 30, in a state where the probe card 30 is connected to the test head 10.

Figure 4:
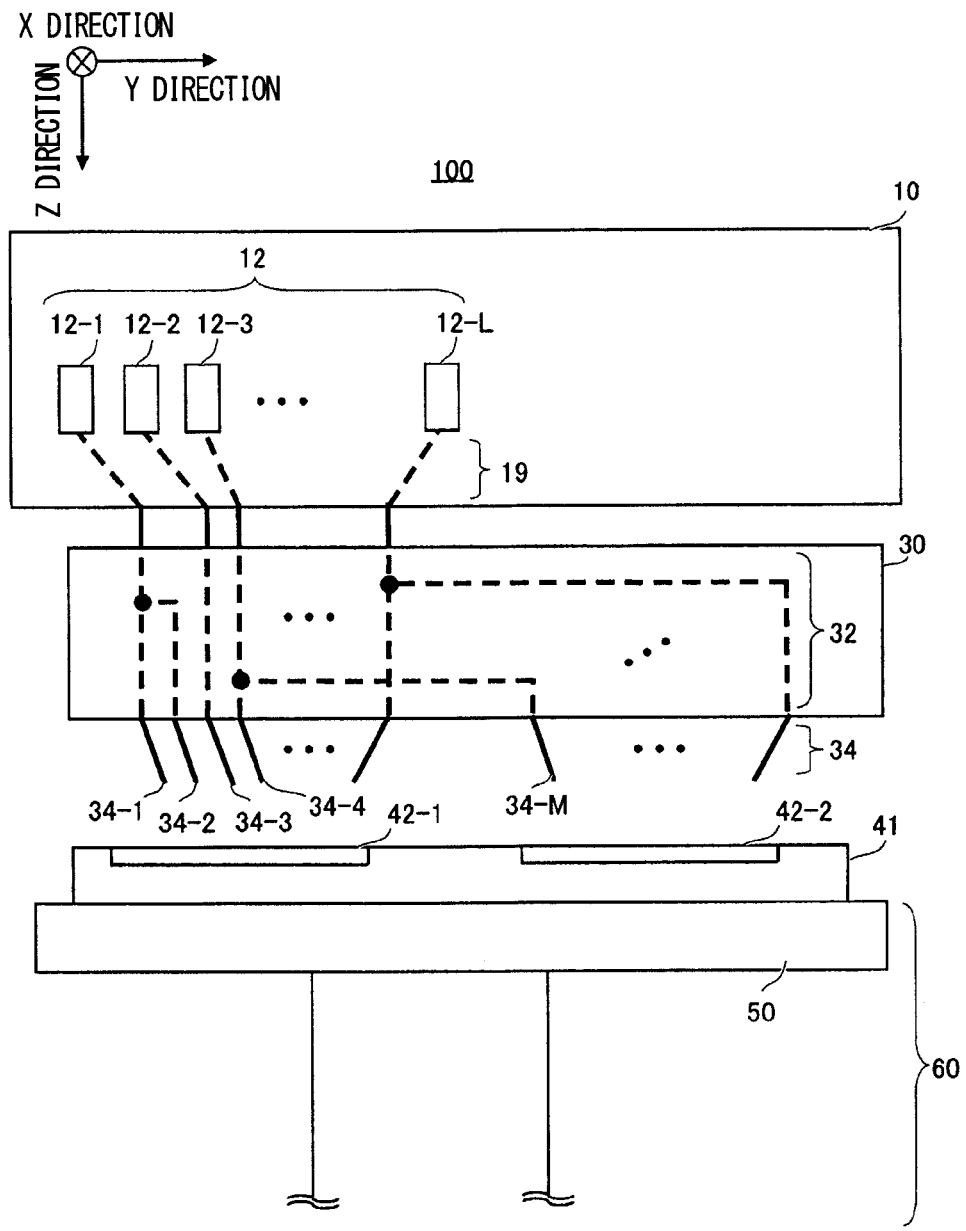
FIG. 4 shows the test system 100 when testing the probe card 30.

FIG. 4 shows the test system 100 when testing the probe card 30. The prober 60 of the test system 100 in this example has a wafer for testing 41 mounted thereon, instead of the wafer under test 40. Other portions of the configuration are the same as those of the test system 100 shown in FIGS. 1 and 3.

The wafer for testing 41 includes a plurality of circuit patterns 42. The wafer for testing 41 may have the same shape as the wafer under test 40. The plurality of circuit patterns 42 are arranged on the wafer for testing 41 in the same pattern as the plurality of DUTs 80.

Figure 5:
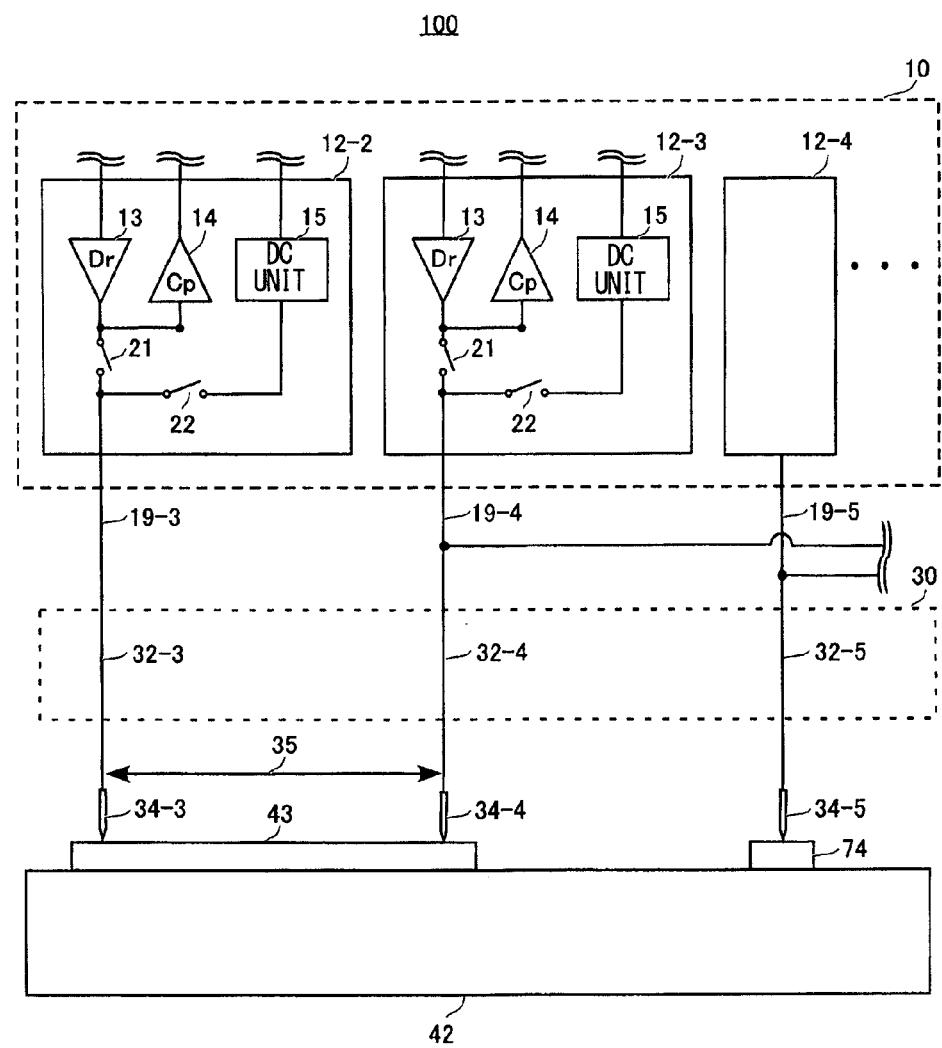
FIG. 5 shows test units 12, the probe card 30, and the circuit pattern 42.

FIG. 5 shows test units 12, the probe card 30, and the circuit pattern 42. The circuit pattern 42 includes a connection wire 43 that connects two probe terminals 34 and a terminal 74. Two test units 12 are electrically connected via the connection wire 43.

The test units 12 connected via the connection wire 43 each output a prescribed signal. For example, one of the DC units 15 outputs a prescribed voltage and the other DC unit 15 outputs a ground potential. If two probe terminals 34 and two connection wires 32 in the probe card 30 that are connected via the connection wire 43 are conductive, then current flows between the two test units 12. Accordingly, the current flowing between the two test units 12 is measured by at least one of the test units 12, thereby enabling testing of the conduction of the two probe terminals 34 and the two connection wires 32. Furthermore, the driver section 13 of one of the test units 12 outputs a signal with a prescribed data pattern, and the conduction between the two probe terminals 34 and the two connection wires 32 may be tested based on whether the comparator section 14 of the other test unit 12 can receive the signal with this data pattern.

The connection wire 43 in this example electrically connects two probe terminals, which are the specified probe terminal 34-3 and the probe terminal 34-4. The connection wire 43 connects two regions in the circuit pattern 42, which correspond to the specified probe terminal 34-3 and the probe terminal 34-4. The two regions in the circuit pattern 42 may be two regions that have a space therebetween equal to the space 35 between the specified probe terminal 34-3 and the probe terminal 34-4.

As described above, the test system 100 measures the output of at least one of two test units 12 connected to two probe terminals 34. For example, the test system 100 measures the output of the test unit 12-2 connected to the specified probe terminal 34-3.

When the electrical signal input from the test unit 12-2 is output to the test unit 12-3 via the connection wire 43, the test system 100 judges that the specified probe terminal 34-3 and the probe terminal 34-4 are each a pass. On the other hand, when the electrical signal input from the test unit 12-2 is not output to the test unit 12-3 via the connection wire 43, the test system 100 judges that at least one of the specified probe terminal 34-3 and the probe terminal 34-4 is a fail. In the example of FIG. 5, the terminal 74 is not connected to the connection wire 43. Therefore, the electrical signal input from the test unit 12-2 is not output to the test unit 12-4 via the terminal 74.

FIG. 5 shows a circuit pattern 42 that includes one connection wire 43, but a circuit pattern 42 may include a plurality of connection wires 43. The connection wires 43 each connect the specified probe terminal 34-3 among the plurality of probe terminals 34 to another one of the probe terminals 34. When the testing of electrical conduction between the specified probe terminal 34-3 and the probe terminal 34-4 is finished, the electrical conduction between the specified probe terminal 34-3 and the probe terminal 34-5 is tested. For example, the prober 60 changes the position of the wafer for testing 41 to connect the specified probe terminal 34-3 and the probe terminal 34-5.

In the test system 100, when testing the probe card 30, the wafer for testing 41 is used instead of the wafer under test 40. In this way, the probe card 30 can be tested without removing the probe card 30 from the test system 100. Furthermore, there is no need for a specialized examination apparatus for testing the probe card 30.

Figure 6:
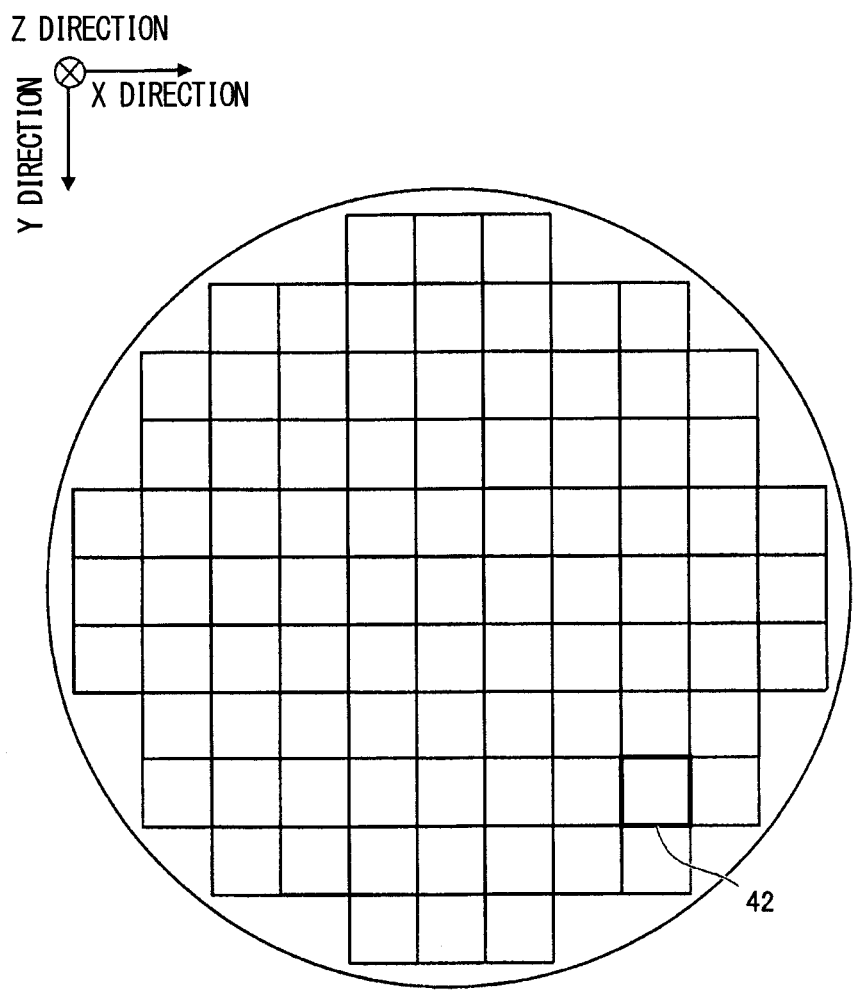
FIG. 6 is a planar view of the wafer for testing 41.

FIG. 6 is a planar view of the wafer for testing 41. The wafer for testing 41 includes a plurality of circuit patterns 42. In order to simplify the view, a reference numeral has been attached to only one of the circuit patterns 42. As described above, the plurality of circuit patterns 42 are arranged with the same pattern as the DUTs 80. Each circuit pattern 42 is connected to a corresponding group of probe terminals 34. Therefore, a plurality of groups of the probe terminals 34 provided for each DUT 80 can be tested in parallel. As a result, the test system 100 of this example can complete the conduction test in a short time.

Figure 7:
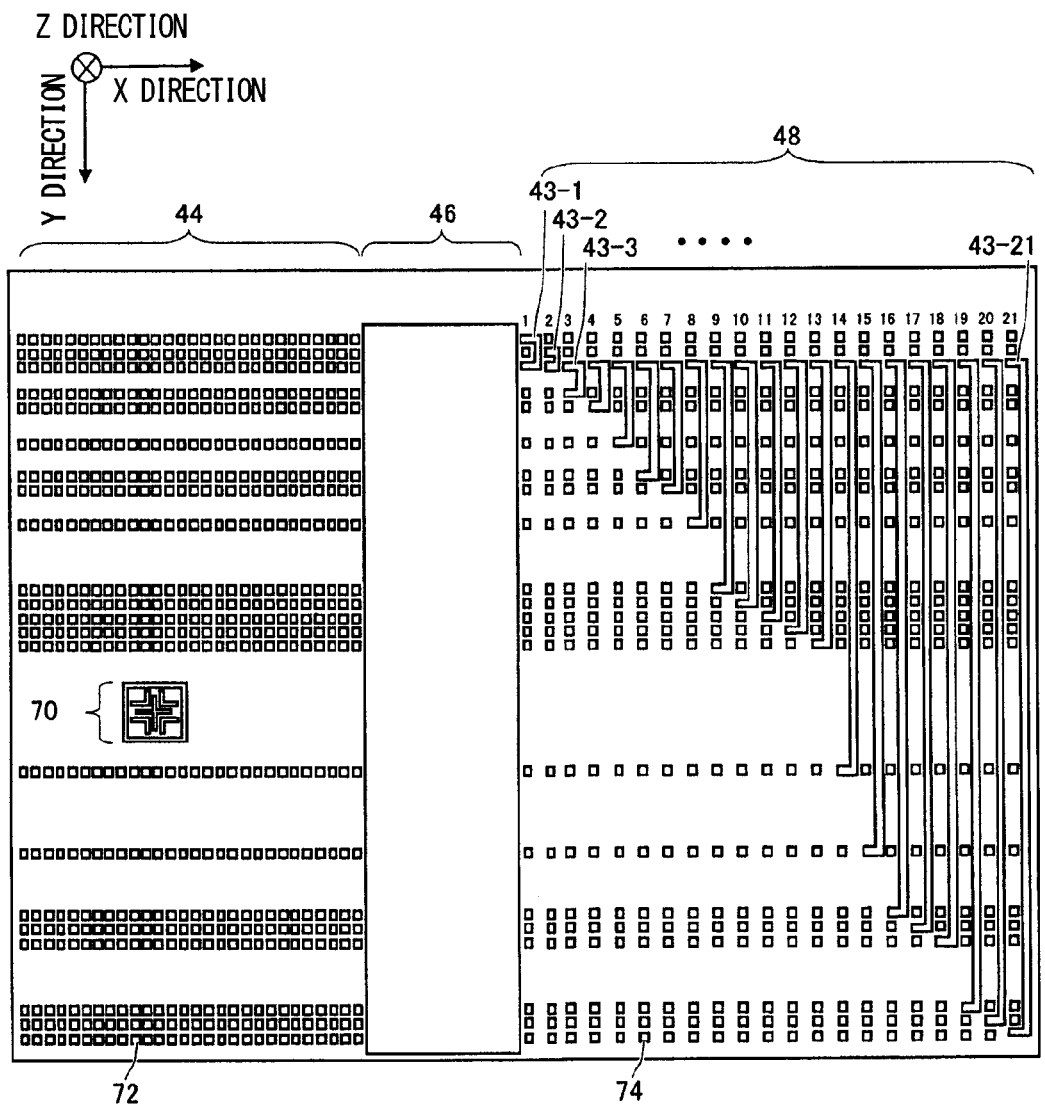
FIG. 7 shows one circuit pattern 42 of the wafer for testing 41 in detail.

FIG. 7 shows one circuit pattern 42 of the wafer for testing 41 in detail. The circuit pattern 42 is provided on the front surface of the wafer for testing 41. The circuit pattern 42 in this example includes a needle mark position accuracy checking pattern 44, an all-pin short pattern 46, and an individual conduction testing pattern 48.

The needle mark position accuracy checking pattern 44 of this example includes an alignment mark 70 and a plurality of terminals 72. In order to simplify the view, a reference numeral is attached to only one of the terminals 72. The terminals 72 are arranged in a matrix in the X direction and Y direction. The arrangement space between terminals 72 in one column in the Y direction is equal to the arrangement space of the probe terminals 34. The alignment mark 70 and the terminals 72 may be formed of aluminum.

The columns of terminals 72 are arranged with spaces therebetween equal to the spaces between the terminals 23 of the DUT 80. However, it should be noted that the probe card 30 is not provided with probe terminals 34 for terminals 23 that are not for testing among the terminals 23 of the DUT 80. Due to this, in the wafer for testing 41 as well, there are no terminals 72 provided corresponding to terminals 23 of the DUT 80 not used for testing. Therefore, the terminals 72 in each column are arranged with non-uniform spacing.

The terminals 72 are used for checking the positions of the tips of the probe terminals 34. The tips of the probe terminals 34 are sharp needles. Therefore, when the probe terminals 34 contact the needle mark position accuracy checking pattern 44 one time, the aluminum terminals 72 are partially cut away. As a result, the terminals 72 can be used for checking needle mark and position accuracy. The number of X-direction rows of terminals 72 and the needle mark and position accuracy can be checked.

The alignment mark 70 in this example is provided in a region between the terminals 72. Specifically, in this example, the alignment mark 70 is provided in the region having the greatest space between the terminals 72 in the column direction. The alignment mark 70 may be provided on the all-pin short pattern 46 or on the individual conduction testing pattern 48. The alignment mark 70 is used to determine the relative position of the wafer for testing 41 with respect to the probe card 30. For example, the test system 100 is provided with a camera that captures an image of the alignment mark 70, to identify the relative position of the wafer for testing 41 with respect to the probe card 30.

The alignment mark 70 of this example has a cross-shaped pattern. Furthermore, the alignment mark 70 has L-shaped marks that are symmetrical with respect to each leg of the cross-shaped pattern. Using this alignment mark 70, the test system 100 can simultaneously identify the relative position of the circuit pattern 42 in the X direction and in the Y direction relative to the probe card 30. The alignment mark 70 may have another shape, as long as the shape enables identification of the relative position of the circuit pattern 42 in the X direction and the Y direction relative to the probe card 30.

The all-pin short pattern 46 may be formed of aluminum. In this example, the all-pin short pattern 46 is a rectangular pattern. In the flat rectangular plane, aluminum is provided as a so-called mat layer. The all-pin short pattern 46 is a pattern for connecting all of the probe terminals 34 corresponding to one DUT 80. By forming a short circuit for all of the probe terminals 34 with the all-pin short pattern 46, the conduction test can be performed relative to the GND potential.

The individual conduction testing pattern 48 includes a plurality of connection wires 43-1 to 43-21 and a plurality of terminals 74. The number of connection wires 43 provided is equal to the number of probe terminals 34, other than the specified probe terminal 34-3, provided facing the one circuit pattern 42. The individual conduction testing pattern 48 may include column numbers formed by an aluminum pattern. In order to simplify the view, a reference numeral is attached to only one of the terminals 74.

The connection wires 43 correspond one-to-one with the probe terminals 34, excluding the specified probe terminal 34-3. Each connection wire 43 connects the corresponding probe terminal 34 to the specified probe terminal 34-3. Each connection wire 43 has a length in the Y direction equal to the space between the corresponding probe terminal 34 and the specified probe terminal 34-3. In this example, among the probe terminals 34 arranged in the Y direction on the probe card 30, the third probe terminal 34 is the specified probe terminal 34-3.

The terminals 74 are arranged in the column and row directions in the same manner as the terminals 72. However, it should be noted that the columns of terminals 74 correspond one-to-one with the probe terminals 34, excluding the specified probe terminal 34-3. In each column of terminals 74, the terminal 74 that corresponds to the probe terminal 34 corresponding to the column and the terminal 74 that corresponds to the specified probe terminal 34-3 are connected by a connection wire 43. In this example, the ends of the connection wires 43 function as these terminals 74.

The long sides in the Y direction of the connection wires 43 are parallel to each other. One end of each connection wire 43 is connected to the specified probe terminal 34-3. These ends of the connection wires 43 are lined up in a straight line in the X direction, such that the specified probe terminal 34-3 can be sequentially connected to these ends of the connection wires 43 by moving the wafer for testing 41 in a direction parallel to the X direction. Furthermore, each connection wire 43 has a U-shape, with squared corners, that has been rotated by 90 degrees. In other words, each connection wire 43 has two row-extension portions that extend in the X direction and a column-extension portion that extends in the Y direction and connects the two row-extension portions. Within this U-shape of each connection wire 43, one or more terminals 74 are provided. In other words, one or more terminals 74 are provided between the two row-extension portions of each connection wire 43.

In this example, the connection wire 43-1 is the wire that connects the two terminals that are the first-row terminal 74 and the third-row terminal 74, among terminals 74 in the first column. The connection wire 43-2 is the wire that connects the two terminals that are the second-row terminal 74 and the third-row terminal 74, among terminals 74 in the second column. The connection wire 43-3 is the wire that connects the two terminals that are the third-row terminal 74 and the fourth-row terminal 74, among terminals 74 in the third column. From this point onward, the connection wire 43-N is the wire that connects the two terminals that are the third-row terminal 74 and the (N+1)-row terminal 74, among the terminals 74 in the N-th column. Here, N is a natural number from 1 to 21.

As described above, the connection wires 43 sequentially connect the one specified probe terminal 34-3 to the other probe terminals 34 among the plurality of probe terminals 34. For example, the connection wire 43-1 connects the probe terminal 34-1 and the specified probe terminal 34-3. After testing of the probe terminal 34-1 and the specified probe terminal 34-3 is completed, the prober 60 moves the wafer for testing 41 in the X direction. In this way, the connection wire 43-2 connects the probe terminal 34-2 to the specified probe terminal 34-3.

When the specified probe terminal 34-3 and the probe terminal 34 that is to be tested are connected by a connection wire 43, the other probe terminals 34 are connected to terminals 74. Therefore, by checking the needle marks in the terminals 74 and the connection wires 43, the positions of the tips of the probe terminals 34 can be checked.

The circuit pattern 42 in this example includes a needle mark position accuracy checking pattern 44, an all-pin short pattern 46, and an individual conduction testing pattern 48. However, the circuit pattern 42 need only include the individual conduction testing pattern 48, and at least one of the needle mark position accuracy checking pattern 44 and the all-pin short pattern 46 may be omitted.

Figure 8:
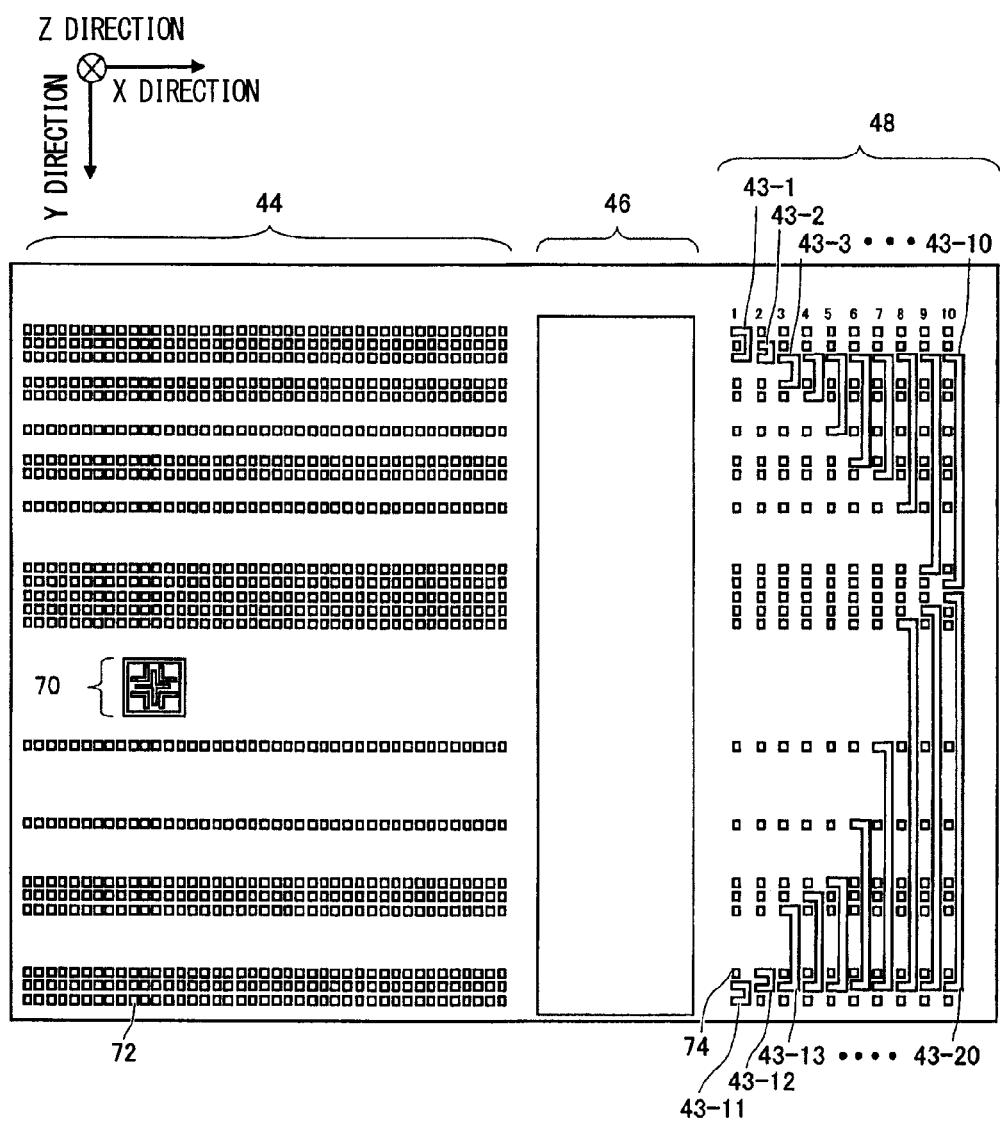
FIG. 8 shows another example of one circuit pattern 42 of the wafer for testing 41.

FIG. 8 shows another example of one circuit pattern 42 of the wafer for testing 41. In this example, among the plurality of probe terminals 34 facing the one circuit pattern 42, two probe terminals 34 in the Y direction are set as specified probe terminals 34. In this case, two connection wires 43 corresponding to the two specified probe terminals 34 are provided in each column of terminals 74. Each connection wire 43 has one end thereof connected to a specified probe terminal 34 and the other end thereof connected to another probe terminal 34. The connection wires 43 may be provided in a manner to connect to the closer probe terminal 34 among the two specified probe terminals 34. Furthermore, the wafer for testing 41 may include three or more connection wires 43 in each column of terminals 74.

Figure 9:
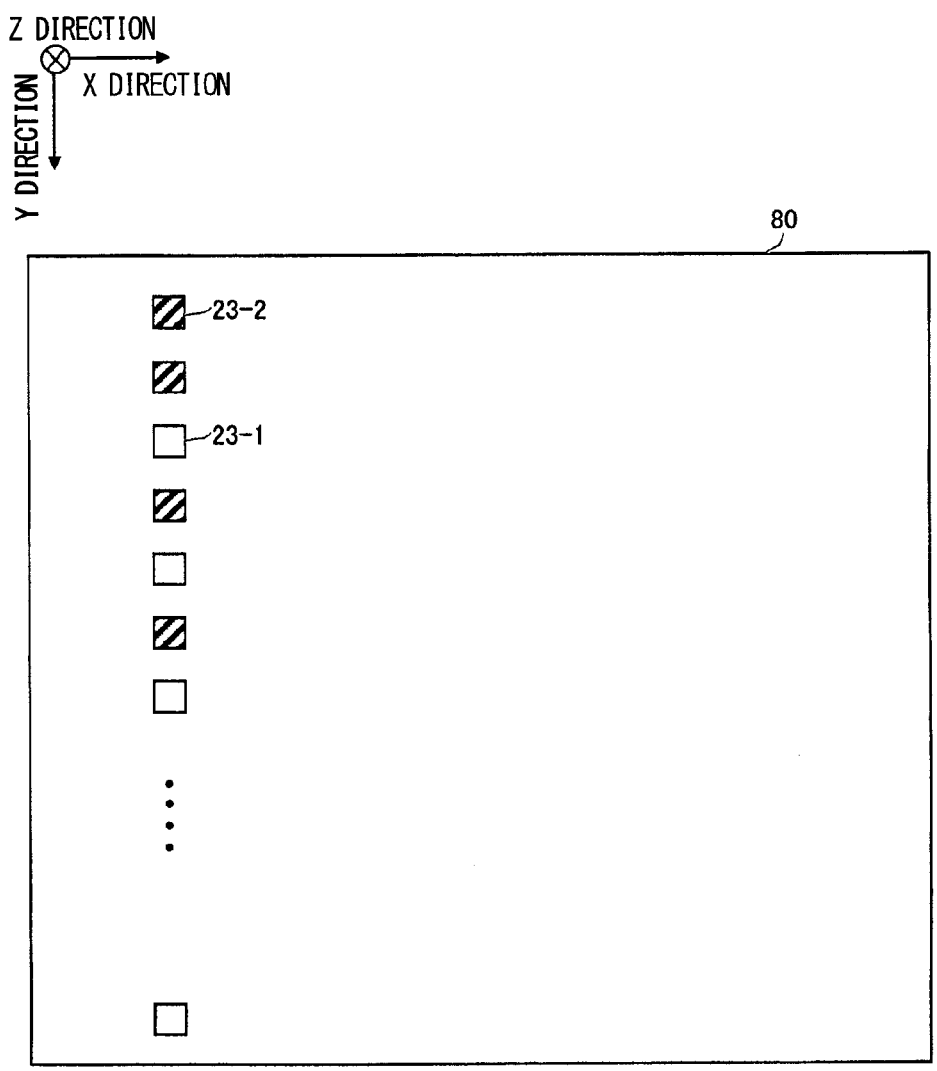
FIG. 9 shows an exemplary arrangement of terminals 23 in a DUT 80.

FIG. 9 shows an exemplary arrangement of terminals 23 in a DUT 80. The DUT 80 has a plurality of terminals 23 arranged in the Y direction. The terminals 23 include terminals 23-1 for testing and terminals 23-2 not used for testing. The terminals 72 and the terminals 74 described in FIGS. 7 and 8 are arranged with the same pattern as the terminals 23-1, in the column direction.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A wafer for testing that tests a probe card, the probe card including a plurality of probe terminals, each probe terminal capable of being connected to a terminal of a device under test, the wafer for testing comprising:
   a plurality of terminals;
   at least three specified terminals among the plurality of terminals aligned in a first direction; and
   a plurality of connection wires, each of which electrically connects a corresponding specified terminal among the at least three specified terminals to a corresponding terminal among the plurality of terminals that is not a specified terminal;
   wherein each of the plurality of connection wires has a first end that is connected to the corresponding specified terminal and is capable of being connected with a specified probe terminal among the plurality of probe terminals and a second end that is connected to the corresponding terminal and is capable of being connected with another probe terminal among the plurality of probe terminals, such that the specified probe terminal can be connected one-to-one with each other probe terminal among the plurality of probe terminals; and
   wherein the first ends of the plurality of connection wires are aligned in the first direction, such that the specified probe terminal can be sequentially connected to the first end of each of the plurality of connection wires, by moving the wafer for testing relative to the probe card parallel to the first direction.

2. The wafer for testing according to claim 1, further comprising:
   a second plurality of terminals;
   at least three second specified terminals among the second plurality of terminals aligned in the first direction; and
   a second plurality of connection wires, each of which electrically connects two terminals among the second plurality of terminals;
   wherein each connection wire among the second plurality of connection wires has a first end that is connected to the corresponding second specified terminal and is capable of being connected with a second specified probe terminal among a second plurality of probe terminals and a second end that is connected to the corresponding terminal and is capable of being connected with another probe terminal among the second plurality of probe terminals, such that the second specified probe terminal can be connected one-to-one with each other probe terminal among the second plurality of probe terminals, and wherein the first ends of the second plurality of connection wires are aligned parallel to the first direction, such that the second specified probe terminal can be sequentially connected to the first end of each of the second plurality of connection wires, by moving the wafer for testing relative to the probe card parallel to the first direction.

3. A test system that tests a device under test, comprising:

a test section that includes a plurality of test units that input or output a signal;

a probe card that includes a plurality of probe terminals connected to a terminal of the device under test, and transmits signals between the device under test and the test section; and a wafer for testing that is connected to the probe card, instead of the device under test, when testing the probe card, and includes a plurality of connection wires each of which electrically connects a corresponding specified terminal among at least three specified terminals to a corresponding terminal among the plurality of terminals that is not a specified terminal, the wafer for testing comprising:

a plurality of terminals;

the at least three specified terminals among the plurality of terminals aligned in a first direction; and wherein the test section measures output of at least one of two test units connected to the two probe terminals, and judges pass/fail of the two probe terminals, wherein each of the plurality of connection wires has a first end that is connected to the corresponding specified terminal and is capable of being connected with a specified probe terminal among the plurality of probe terminals and a second end that is connected to the corresponding terminal and is capable of being connected with another probe terminal among the plurality of probe terminals, such that the specified probe terminal can be connected one-to-one with each other probe terminal among the plurality of probe terminals, and wherein the first ends of the plurality of connection wires are aligned in the first direction, such that the specified probe terminal can be sequentially connected to the first end of each of the plurality of connection wires, by moving the wafer for testing relative to the probe card parallel to the first direction.

4. The test system according to claim 3, wherein the wafer for testing further comprising:

a second plurality of terminals;

at least three second specified terminals among the second plurality of terminals aligned in the first direction; and a second plurality of connection wires, each of which electrically connects two terminals among the second plurality of terminals; and wherein each connection wire among the second plurality of connection wires has a first end that is connected to the corresponding second specified terminal and is capable of being connected with a second specified probe terminal among a second plurality of probe terminals and a second end that is connected to the corresponding terminal and is capable of being connected with another probe terminal among the second plurality of probe terminals, such that the second specified probe terminal can be connected one-to-one with each other probe terminal among the second plurality of probe terminals, and the first ends of the second plurality of connection wires are aligned parallel to the first direction, such that the second specified probe terminal can be sequentially connected to the first end of each of the second plurality of connection wires, by moving the wafer for testing relative to the probe card parallel to the first direction.

\* \* \* \* \*